United States Patent
Lam et al.

(10) Patent No.: US 10,998,022 B2
(45) Date of Patent: May 4, 2021

(54) APPARATUSES AND METHODS FOR REDUCING ACCESS DEVICE SUB-THRESHOLD LEAKAGE IN SEMICONDUCTOR DEVICES

(71) Applicant: MICRON TECHNOLOGY, INC., Boise, ID (US)

(72) Inventors: Boon Hor Lam, Boise, ID (US); Shawn M. Hilde, Meridian, ID (US); Karl L. Major, Boise, ID (US); Travis Marley, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/543,240

(22) Filed: Aug. 16, 2019

(65) Prior Publication Data

US 2021/0050042 A1    Feb. 18, 2021

(51) Int. Cl.
| | |
|---|---|
| *G11C 8/00* | (2006.01) |
| *G11C 8/08* | (2006.01) |
| *G11C 8/10* | (2006.01) |
| *G11C 11/406* | (2006.01) |
| *G11C 11/408* | (2006.01) |

(52) U.S. Cl.
CPC ............ *G11C 8/08* (2013.01); *G11C 8/10* (2013.01); *G11C 11/406* (2013.01); *G11C 11/4085* (2013.01); *G11C 11/4087* (2013.01)

(58) Field of Classification Search
CPC ......... G11C 8/08; G11C 8/10; G11C 11/4085; G11C 11/406; G11C 11/4087
USPC ..................................... 365/230.06
See application file for complete search history.

(56) References Cited

U.S. PATENT DOCUMENTS

| | | | |
|---|---|---|---|
| 2009/0310398 A1* | 12/2009 | Nguyen ............... | G11C 11/413 365/156 |
| 2011/0176375 A1* | 7/2011 | Lee ......................... | G11C 8/08 365/194 |

* cited by examiner

Primary Examiner — Huan Hoang
(74) Attorney, Agent, or Firm — Dorsey & Whitney LLP

(57) ABSTRACT

In some examples, an inactive word line voltage control (IWVC) circuit may be configured to provide a respective subword driver associated with a memory bank of a plurality of memory banks a non-active potential from a default off-state word line voltage (VNWL) to a reduced voltage VNWL lower than the default VNWL following a time duration after activating the memory bank. The IWVC circuit may also be configured to provide the respective subword driver with the default VNWL responsive to pre-charging the memory bank. The IWVC circuit may include a multiplexer coupled to the subword driver and configured to provide the default VNWL or the reduced voltage VNWL to the respective subword driver responsive to a VNWL control signal. The IWVC circuit may also include a time control circuit configured to provide the VNWL control signal responsive to a clock signal and a time control signal.

24 Claims, 8 Drawing Sheets ns and MET FOR
REDUCING ACCESS DEVICE
SUB-THRESHOLD LEAKAGE IN
SEMICONDUCTOR DEVICES

BACKGROUND

A semiconductor memory device, such as a DRAM (Dynamic Random Access Memory), includes a memory cell array having memory cells disposed at intersections between word lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FX) selected by a second portion of the row address.

Due to the scaling down of array access devices in semiconductor fabrication, such as the pitch size of transistor circuits becoming smaller and the need for rebalancing of the doping of implants, the inherent access device off-state leakage increases. This increased access device IOFF leakage may cause the memory device to be less reliable. For example, cells that are storing data of "1" may be affected when sense amplifiers are driving the bit lines to "0". Such increased access device IOFF leakage has imposed limits on further scaling of the memory cell. As such, reducing the access device IOFF leakage is desirable.

DETAILED DESCRIPTION

Figure 1:
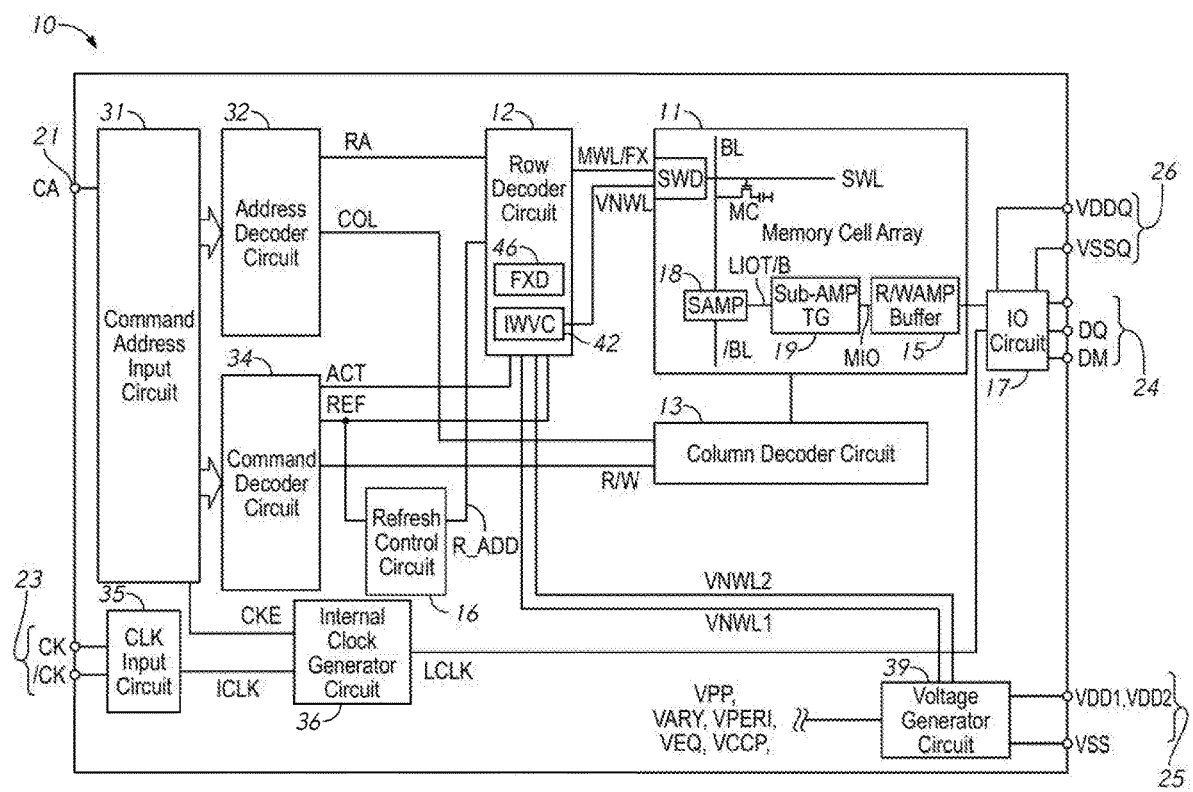
FIG. 1 is a block diagram of a semiconductor device according to some examples described in the disclosure.

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FX), which is selected by a second portion of the row address. The MWL may be driven by main word drivers (MWD) and the word driver line FX may be driven by word drivers (FXD). Both the MWL and FX must be driven to active states to select the desired subword line in the memory device. The subword lines are driven by subword drivers. When the subword line is driven to an active potential, the memory cell is connected to the corresponding bit line. On the other hand, during a period in which the subword line is driven to a non-active potential, the memory cell and the bit line are kept in a cut-off state. In driving subword lines to the active potential, relatively high voltages are provided to the subword drivers of a memory mat. In contrast, in driving the subword line to a non-active potential, relatively low voltages are provided to the subword drivers of the memory mat. When a memory bank has been activated, the access device IOFF leakage tends to increase. As such, a subword line being active for a longer time duration may have a higher risk than a subword line being active for a short time duration on corrupting an inactive subword line. In some examples, following a time duration after activation of a word line (to activate a bank), when an access device IOFF leakage in the activated bank may occur, the default (e.g., relatively low or a negative voltage) non-active potential is set a reduced voltage non-active potential. This reduced voltage non-active potential may decrease access device IOFF leakage associated with activation of the memory bank. Following deactivation of a row that had been involved in a page access operation, the non-active potential is restored to the default voltage.

Providing the reduced voltage following a time duration after activation of the memory bank, may consume less power than, for example, providing the reduced voltage immediately when the memory bank is activated. That is, providing the reduced voltage for a portion of the time the memory bank is active may consume less power than providing the reduced voltage for the entire time the memory bank is active.

FIG. 1 is a block diagram of a semiconductor device 10 according to some examples described in the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells (MC) disposed at the intersections. The SWL may be driven by subword drivers SWD. For clarity, only one SWL, SWD, BL, and MC are shown in FIG. 1. A plurality of main word lines MWL and word driver lines FX may be coupled between a row decoder circuit 12 and the SWD. The selection of a main word line MWL and a word driver line FX is carried out by the row decoder circuit 12, and the selection of the bit line BL is carried out by a column decoder circuit 13. For example, the row decoder circuit 12 may include a word line driver 46 configured to generate signals on the word line driver lines FX for the memory cell array 11.

In some examples, the row decoder circuit 12 may also include an inactive word line voltage control (IWVC) circuit 42 to supply the memory cell array with an off-state word line voltage (VNWL) as the non-active potential of the subword drivers. The VNWL may vary depending on the activation state of the memory cell array 11. For example, when a word line is held active after a time duration, the VNWL may switch/shift from a first VNWL, e.g., VNWL1, to a second VNWL, e.g., VNWL2. The VNWL1 may be a default non-active potential. In some embodiments of the disclosure, the default non-active potential is a negative voltage level. The VNWL2 may be a reduced voltage that is less than the default voltage VNWL1. When the memory cell array is pre-charged, the VNWL may switch/shift to the default negative voltage VNWL1. The reduced VNWL2 may result in a reduction of access device IOFF leakage, especially for memory cells that are being accessed.

With further reference to FIG. 1, the sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches to read/write amplifiers and buffers 15. Turning to the explanation of a plurality of external terminals included in the semiconductor device 10, the plurality of external terminals includes command and address terminals 21, clock terminals 23, data terminals 24, and power supply terminals 25 and 26.

The command and address terminals 21 are supplied with command and address signals CA. The CA signals provided to the command and address terminals 21 include commands and addresses. Addresses included in the CA signals are transferred via a command/address input circuit 31 to an address decoder circuit 32. The address decoder circuit 32 receives the addresses and supplies a decoded row address signal RA to the row decoder circuit 12, and a decoded column address signal COL to the column decoder circuit 13.

Commands included in the CA signals provided to the command and address terminals 21 are input to a command decoder circuit 34 via the command/address input circuit 31. The command decoder circuit 34 decodes the commands to provide various internal command signals. For example, the internal commands may include a row command signal to select a word line and a column command signal, such as a read command or a write command, to select a bit line.

When a row activation command is issued and a row address is timely supplied with the activation command, and a column address is timely supplied with a read command, read data is read from a memory cell MC in the memory cell array 11 designated by these row address and column address. More specifically, the row decoder circuit 12 selects a main word line MWL, word driver line FX, and subword line SWL indicated by the row address RA so that the associated memory cell MC is subsequently connected to the bit line BL. Further, when the memory cell MC is selected by the row address and the associated row is activated by the row activation command, the main word line MWL may be active and the word driver line FX may be active. This results in the subword line SWL being active. Conversely, when the memory cell MC is not selected, the word driver line FX may be inactive, driving the subword line SWL to be at non-active potential, e.g., off-state word line voltage VNWL.

With further reference to FIG. 1, the read data DQ is output externally from the data terminals 24 via a read/write amplifier 15 and an input/output circuit 17. Similarly, when the row activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address.

The device 10 may include a refresh control circuit 16 for carrying out refresh operations. During a refresh operation, memory cells associated with one or more word lines may be refreshed. The refreshing of a word line may be referred to as a refresh, and a refresh operation may include multiple refreshes. The refresh operations may be an auto-refresh operation and/or other refresh operations. In some embodiments, a refresh command may be externally issued to the device 10 and provided to the command decoder circuit 34 which provides the command to the refresh control circuit 16 and row decoder circuit 12. In some embodiments, the refresh command may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation. As will be described in more detail, a word line (e.g., subword line) indicated by the refresh address R_ADD may be refreshed across multiple memory mats and/or memory banks during a refresh operation.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31. In a non-limiting example, a DLL circuit can be used as the internal clock generator 36. The phase controlled internal clock signal LCLK is supplied to the input/output circuit 17 and is used as a timing signal for determining an output timing of the read data DQ.

The power supply terminals 25 are supplied with power supply voltages VDD1, VDD2, and VSS. These power supply voltages VDD1, VDD2, and VSS are supplied to an internal voltage generator circuit 39. The internal voltage generator circuit 39 provides various internal voltages VPP, VARY, VPERI, VEQ, VCCP, VNWL1 and VNWL2.

The internal potentials VCCP, VNWL1, and VNWL2 are potentials to be mainly used in the row decoder circuit 12. The row decoder circuit 12 may drive the main word line MWL and subword line SWL, which are selected based upon the address signal ADD, to a VCCP level corresponding to a high potential (e.g., 3.1 V) so that a cell transistor of the memory cell MC is turned on. The internal voltages VNWL1 and VNWL2 may be supplied to non-active potential to be used in the row decoder circuit 12 to pull down the subword line SWL when an associated row is activated or is in pre-charge state.

The internal potential VARY and VEQ are potentials to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
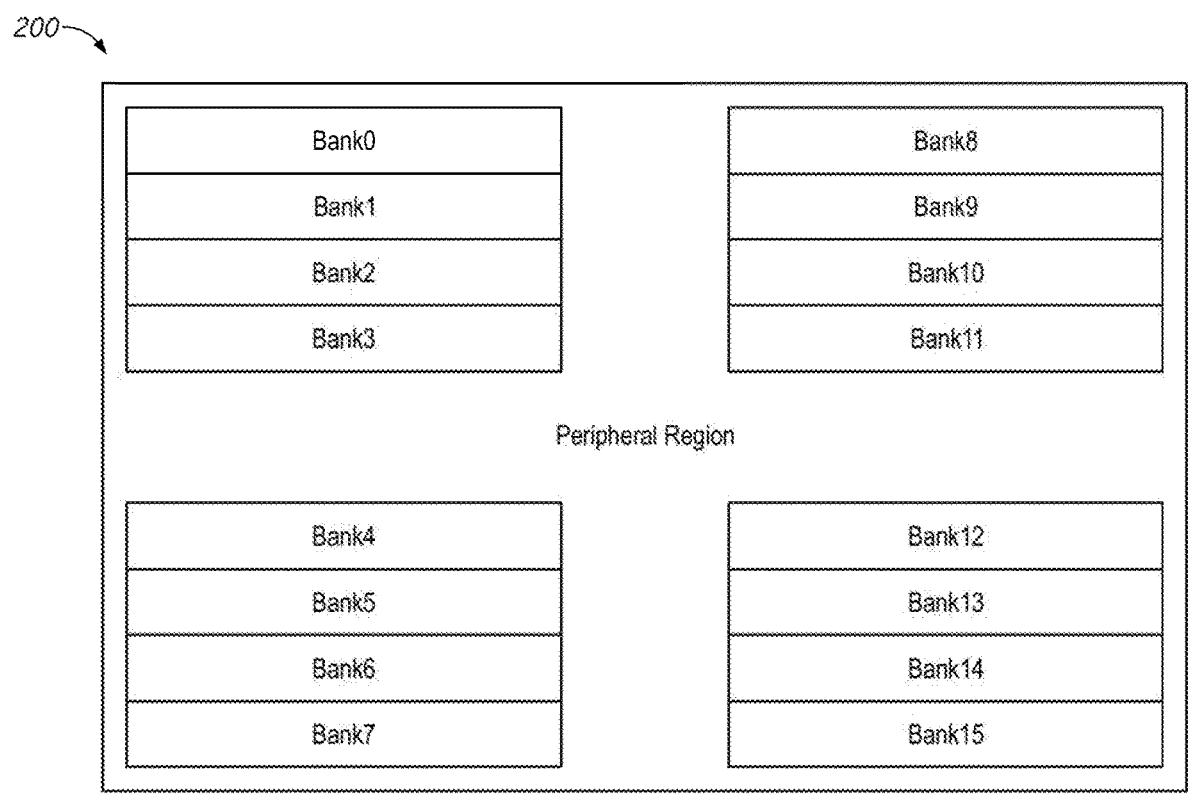
FIG. 2 is a diagram of an example layout of a semiconductor device according to some examples described in the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 (FIG. 1).

The memory cell array 200 of the example shown in FIG. 2 is divided into sixteen banks Bank0 to Bank15. A row decoder circuit (e.g., row decoder circuit 12 of FIG. 1; not shown in FIG. 2) may be disposed between adjacent banks and/or in the peripheral circuit region. On the other peripheral circuit region, various peripheral circuits and external terminals may be disposed (not shown in FIG. 2).

Figure 3:
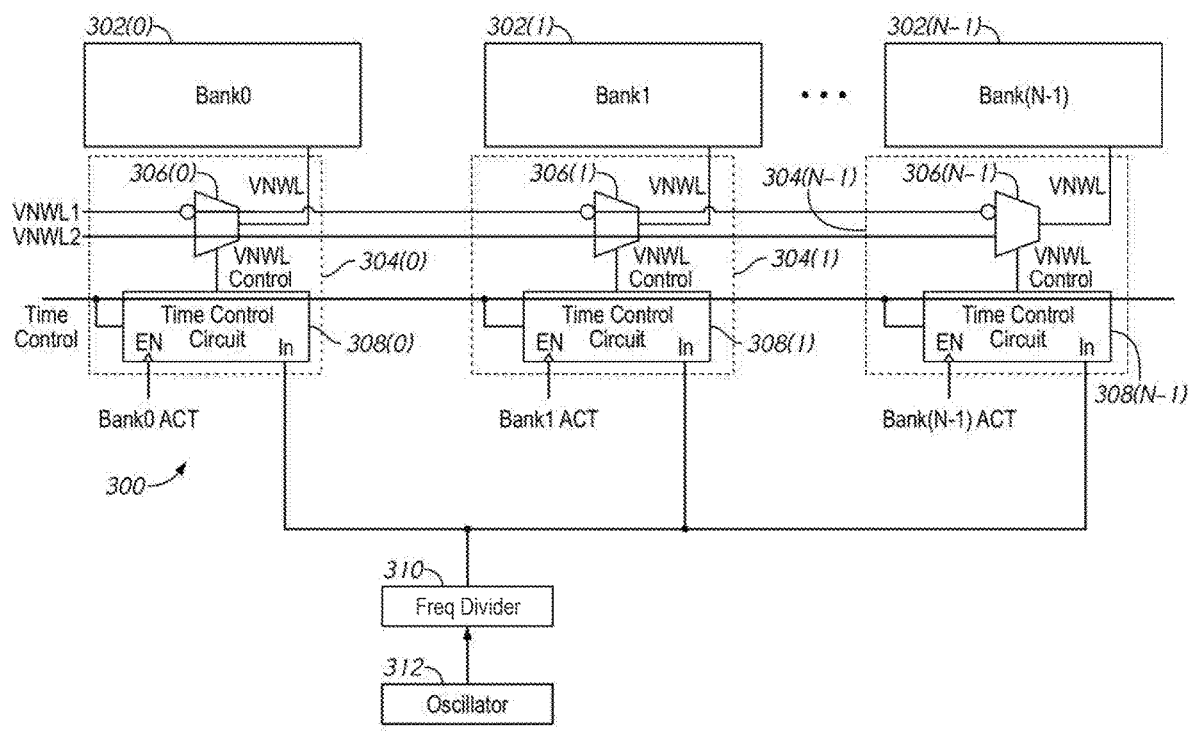
FIG. 3 is a diagram of an inactive word line voltage control circuit according to some examples described in the disclosure.

FIG. 3 is a diagram of an inactive word line voltage control (IWVC) circuit according to some examples described in the disclosure. An IWVC circuit 300 may be implemented in a row decoder circuit 12 (in FIG. 1) in some embodiments of the disclosure. The IWVC circuit 300 may be implemented outside the row decoder circuit 12 in some embodiments of the disclosure, or may have portions included both inside and outside the row decoder circuit 12. In some examples, the IWVC circuit 300 may include multiple IWVC sub-circuits, e.g., 304(0), 304(1), . . . 304(N−1), each respectively associated with a respective memory bank, such as MCs 302(0), 302(1), . . . , 302(N−1).

An IWVC sub-circuit, such as 304(0), may be configured to provide an off-state word line voltage VNWL1 or VNWL2 to the associated memory bank responsive to a VNWL control signal. In a non-limiting example, the IWVC sub-circuit, e.g., 303(0), may include a multiplexer, e.g., 306(0), where the multiplexer 306(0) is coupled to a respective memory bank, e.g., Bank0 at 302(0). Each of the multiplexers 306 may have first and second input terminals respectively provided VNWL1 and VNWL2 and have a control terminal provided a VNWL control signal. The multiplexer may be configured to supply either VNWL1 or VNWL2 to the associated memory bank responsive to the VNWL control signal.

In some examples, an IWVC sub-circuit, e.g., 304(0), may include a time control circuit 308(0) configured to provide the VNWL control signal responsive to a bank active command, e.g., a memory ACT command from the command decoder circuit (34 in FIG. 1). For example, the time control circuit 308(0) may have an enable terminal provided with the memory ACT command signal from the command decoder circuit. In some examples, the time control circuit 308(0) may include a clock terminal to which a clock signal is provided. The clock signal may be provided by a clock circuit. An example clock circuit may include an oscillator 312 and a frequency divider 310. The oscillator 312 and/or divider 310 may be an existing circuit of a semiconductor device. For example, in some embodiments of the disclosure, the oscillator 312 may be a refresh oscillator that already exists in the semiconductor device. Other oscillators in the memory device may also be possible.

In some examples, the time control circuit 308(0) may be an N-bit counter, which may be activated when the ACT command signal provided to the time control circuit becomes active. The counter may be configured to provide the time duration. For example, the counter may counts based on the clock signal provided at the clock terminal of the time control circuit 308(0) until the count reaches some threshold value. As described above, the clock signal may be provided the oscillator 312 and the frequency divider 310. The threshold value may be provided by a time control signal at a time control terminal of the counter. For example, the time control signal may be provided by a test mode fuse bank, which may have lines to represent multiple bits of the threshold value. The time control signal and the clock signal provided to the time control circuit define the time duration. In other words, when the counter stops, the time duration has elapsed since the time control circuit (e.g., 308(0)) received an activated ACT command line. When the time duration has elapsed, the time control circuit may provide the VNWL control signal to supply the VNWL voltage to the memory bank.

The IWVC sub-circuits 304(1) through 304(N−1) may be similar to the IWVC sub-circuit 304(0) previously described. Consequently, the IWVC sub-circuits 304(1) through 304(N−1) will not be described in detail herein.

Figure 4:
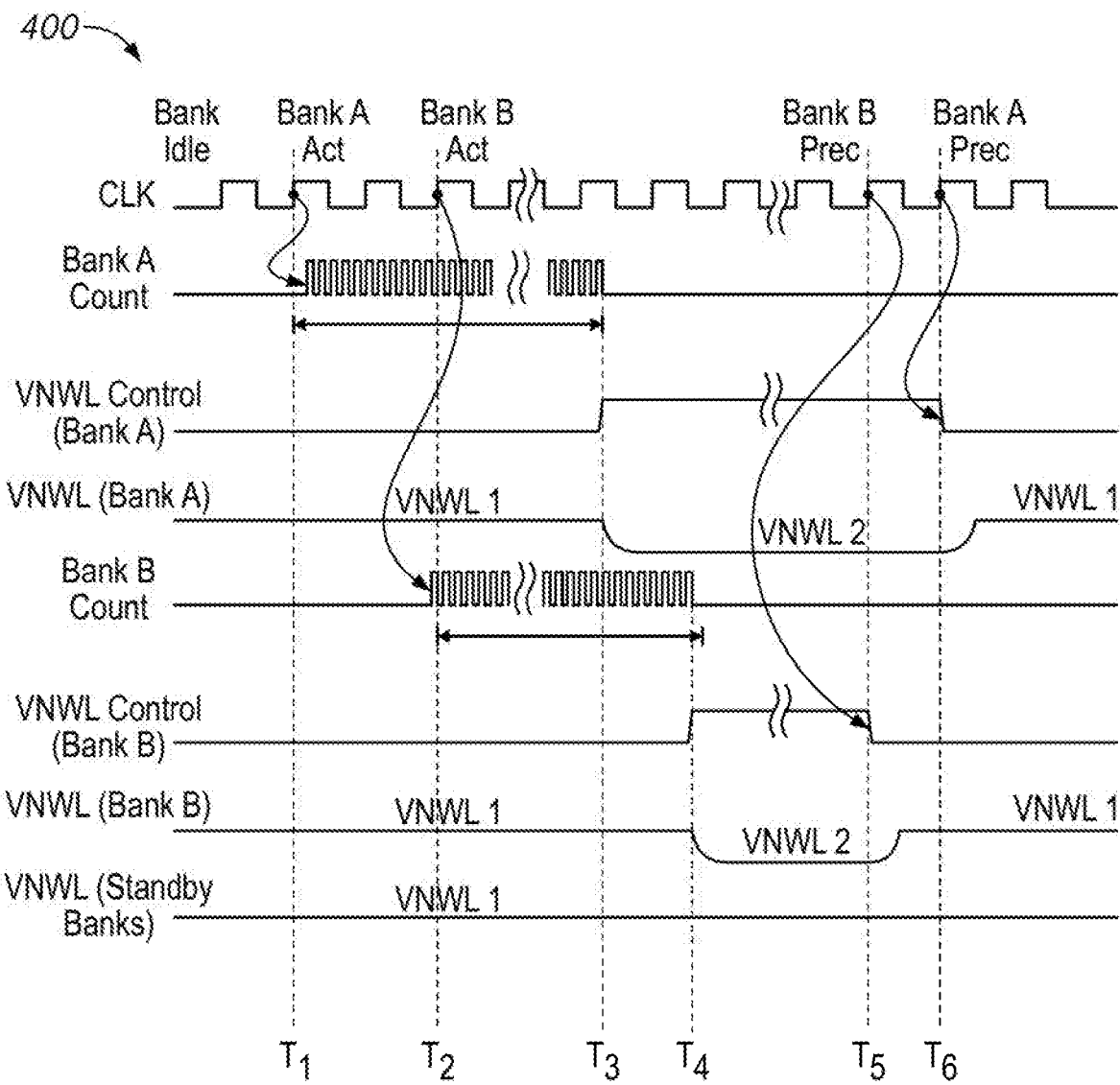
FIG. 4 is a timing diagram of various signals during operation of an inactive word line voltage control circuit according to some examples described in the disclosure.

FIG. 4 is a timing diagram 400 of various signals during operation of an inactive word line voltage control circuit according to some examples described in the disclosure. In some embodiments of the disclosure, the inactive word line voltage control circuit may be configured as IWVC 42 in FIG. 1. In some embodiments of the disclosure, the inactive word line voltage control circuit may be configured as IWVC 300 of FIG. 3.

In the example shown in FIG. 4, the default VNWL may be at a first negative voltage, e.g., VNWL1. When a bank ACT command is active for a memory bank (e.g., Bank A) at a rising edge, e.g., at time T1, the time control circuit coupled to the memory bank is activated for a time duration controlled by the time control circuit (e.g., 308 in FIG. 3). The time duration may be defined by the time control signal. In a non-limiting example, the time control signal may be set to cause the time duration of the time control circuit (e.g., 308 in FIG. 3) to be around 7~10 μs. When the time duration expires, at time T3, the time control circuit may provide a VNWL control signal, which causes the multiplexer associated with the memory bank (e.g., Bank A) to select a reduced voltage VNWL, e.g., VNWL2, to be provided. The reduced voltage VNWL2 may be a second negative voltage that is less than the default voltage VNWL1.

When the bank (e.g., Bank A) is pre-charged responsive to a precharge command at time T6, the VNWL control signal becomes deactivated, which causes the multiplexer associated with the memory bank to select the default off-state word line voltage VNWL1. In a non-limiting example, for a DRAM memory device, the VNWL1 may be around negative 100 mv, the VNWL2 may be 50-100 mv lower than VNWL1.

With further reference to FIG. 4, the IWVC for Bank B operates in a similar manner as the IWVC for Bank A. For example, the VNWL for Bank B is at the default voltage VNWL1. When a bank ACT command is active for Bank A at a rising edge, e.g., at time T2, the time control circuit coupled to the memory bank is activated for a time duration. For example, the time duration may be set by the time control signal and frequency divider to be around 7~10 μs. When the time duration expires, at time T4, the time control circuit may generate the VNWL control signal to cause the multiplexer associated with the memory bank (e.g., Bank B) to select the reduced voltage VNWL2 to be provided. When the bank (e.g., Bank B) is pre-charged responsive to a precharge command at time T5, the VNWL control may cause the multiplexer associated with the memory bank to select the default VNWL, e.g., VNWL1. In the example shown in FIG. 4, the VNWL for Bank B is switched/shifted from VNWL2 to VNWL1 prior to the VNWL for Bank A is switched/shifted from VNWL2 to VNWL1.

FIGS. 3 and 4 are illustrated for bank-level operations, however, the embodiments described with respect to FIGS. 3 and 4 may also be applied to sub-bank levels. Although VNWL1 and VNWL2 are shown as provided by the voltage generator circuit 39 in FIG. 1, other voltage generators may be used as well. For example, a negative half-voltage (0.5 v) generator may already be included in a memory device and can be used to provide the reduced negative voltage VNWL2 for the non-active potential. Similarly, the default voltage VNWL1 may be ⅕ of the reduced negative voltage and also provided from the negative half-voltage generator.

Although an example time duration of around 7~10 μs is previously described, the time duration may be longer or shorter without departing from the scope of the disclosure. In some embodiments of the disclosure, the time duration is longer than an average refresh interval for refresh operations, and thus, during refresh operations, such as auto-refresh or self-refresh operations, the VNWL does not change between a default voltage and a reduced voltage while refresh operations are performed. In some embodiments of the disclosure, the time duration may be shorter than the average refresh interval, however.

Figure 5:
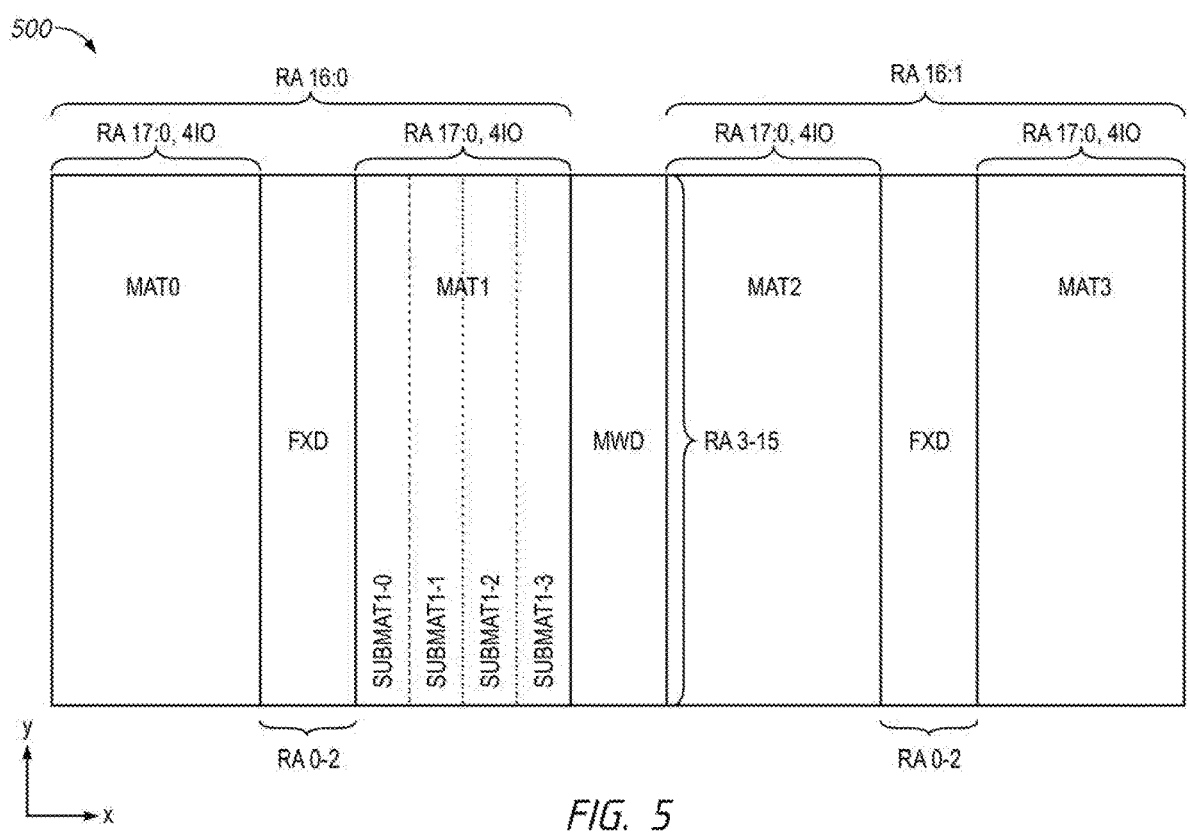
FIG. 5 is a diagram of an example configuration of a bank of a memory cell array of a semiconductor device according to some examples described in the disclosure.

FIG. 5 is a diagram for an example configuration of a bank 500 of a memory cell array according to some examples described in the disclosure. The banks Bank0 to Bank15 of FIG. 2 may each include the configuration of the bank 500 of FIG. 5 in some embodiments of the disclosure.

In some examples, the bank 500 may include a plurality of memory mat regions, such as MAT0-3. In the example shown in FIG. 5, the bank 500 has four memory mat regions, but the bank 500 could include more or less memory mat regions in other examples. As indicated by the dotted lines in memory mat region MAT1, each memory mat region may be divided into multiple sub-regions SUBMAT1-0-3. While the example shown in FIG. 5 includes four sub-regions, memory mat regions MAT0-3 may include more or less sub-regions in other examples. Each sub-region SUBMAT1-0-3 may include a plurality of memory mats (e.g., 64) aligned in the Y-direction. For clarity, the individual memory mats are not shown in FIG. 5. Subword driver rows SWDA (not shown in FIG. 5) may be on the two sides in the X direction of each memory mat, and sense amplifier rows SAA may be on the two sides in the Y direction of each memory mat. The memory mats of each sub-region SUB-MAT1-0-3 may be provided to a corresponding IO (e.g., DQ pad) in some embodiments.

The subword driver operations may be controlled by a row decoder circuit, for example, the row decoder circuit 12 of FIG. 1. When receiving a row address RA, the row decoder selects a subword line by activating an appropriate main word driver (MWD) and an appropriate word driver (FXD) indicated by the row address RA. In the example shown in FIG. 5, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWDs, each configured to activate a corresponding main word line (MWL). Continuing this example, each word driver FXD block may include eight word drivers FXDs, each configured to activate a corresponding word driver line (FX). In the example shown in FIG. 5, bits 3-15 of the row address RA encode the main word line MWL and bits 0-2 of the row address RA encode the word driver line FX. However, other encoding schemes may be used.

Figure 6:
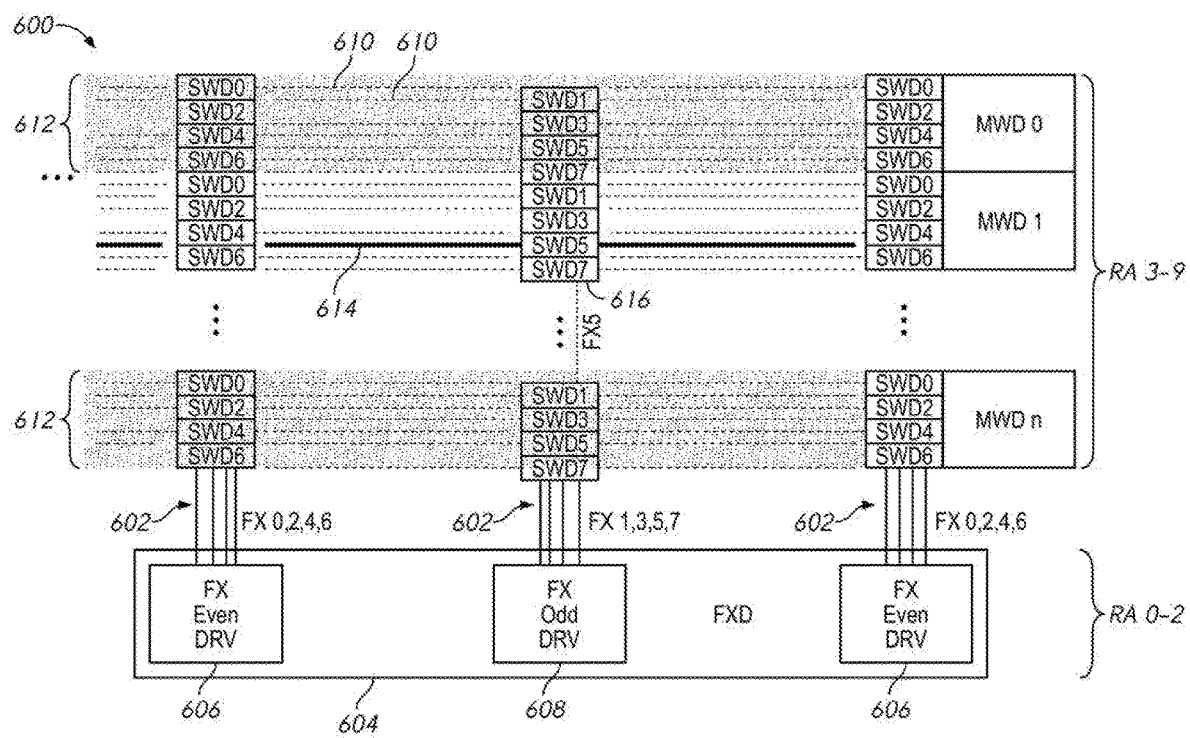
FIG. 6 is a schematic diagram of a portion of a bank of a memory cell array according to some examples described in the disclosure.

FIG. 6 is a schematic diagram of a portion of a bank 600 according to some examples described in the disclosure. In some embodiments of the disclosure, the portion of the bank 600 shown in FIG. 6 may be included in the bank 500 of FIG. 5, the memory cell array 200 of FIG. 2, and/or the memory cell array 11 of FIG. 1.

The subword lines are adjacent to each other, and driven by subword drivers SWD0-7 on different subword driver rows. Corresponding main word signals MWS and driving signals FX and non-active potential (e.g., off-state word line voltage VNWL) are provided to the subword drivers SWD0-7. The main word signals and the driving signals FX are signals that may be provided by main word drivers MWD0-N and word drivers FXD 604 included with the row decoder circuit 12, based upon the row address RA as described with reference to FIG. 5. The main word signal is provided to the subword drivers SWD0-7 over a main word line (not shown in FIG. 6), and the driving signals FX are provided to the subword drivers SWD0-7 over word driver lines 602.

A main word line MWL may extend over array regions of a respective memory mat (e.g., a memory mat in SUB-MAT1-0 in FIG. 3) to provide the main word signal to the subword driver rows SWD0-7 of the memory mat to activate the subword drivers SWD0-7 of the memory mat. That is, when a main word driver MWD is activated, it may provide active main word signals to all the subword drivers SWD0-7 of the mat. As will be described below, the driving signals FX include complementary signals FXT and FXF. Each word driver line 602 of word driver FXD 604 provides driving signals FX to at least one subword driver SWD in each mat. In the example shown in FIG. 6, the word driver FXD 604 includes even word drivers 606 and odd word drivers 608. The even word drivers 606 provide respective driving signals to even numbered subword drivers SWD0, SWD2, SWD4, and SWD6, of each memory mat and odd word drivers 608 provide respective driving signals to odd numbered subword drivers SWD1, SWD3, SWD5, and SWD7 of each memory mat. However other arrangements may be used in other examples. In the example shown in FIG. 6, each line of the word driver FXD may be coupled to a corresponding subword driver SWD0-7 in each memory mat. For example, FX line 5 may be coupled to the subword driver SWD5 of each memory mat.

In the example operation shown in FIG. 6, a row address RA has indicated MWD1 should be activated and odd word driver 608 associated with word driver line FX 5 should be activated. As shown by the shaded regions 612, subword lines 610 associated with the inactive main word drivers MWD0, MWDn remain inactive, even the subword lines associated with word driver line FX 5 is active. However, the subword line 614 driven by subword driver SWD5 616 associated with activated MWD1 and FX 5 is activated. Thus, a selected subword line SWL of the selected memory mat associated with MWD1 is driven to the active potential by the corresponding activated subword driver SWD5.

In some examples, the other subword drivers SWD of the selected memory mat drive the respective unselected subword lines SWL to the non-active potential (e.g., VNWL1, VNWL2) to remain inactive. Subword drivers SWD of unselected memory mats MAT (e.g., memory mats associated with MWD0 and MWDn) remain deactivated, and the subword lines SWL of the unselected memory mats MAT are not provided a voltage, or provided with a non-active potential (e.g., VNWL) in some examples. Whereas a subword driver SWD is coupled to a word driver FXD and a main word driver MWD, in order for a subword line SWL associated with the subword driver SWD to be activated, both the word driver FXD and the main word driver MWD must be activated.

Figure 7:
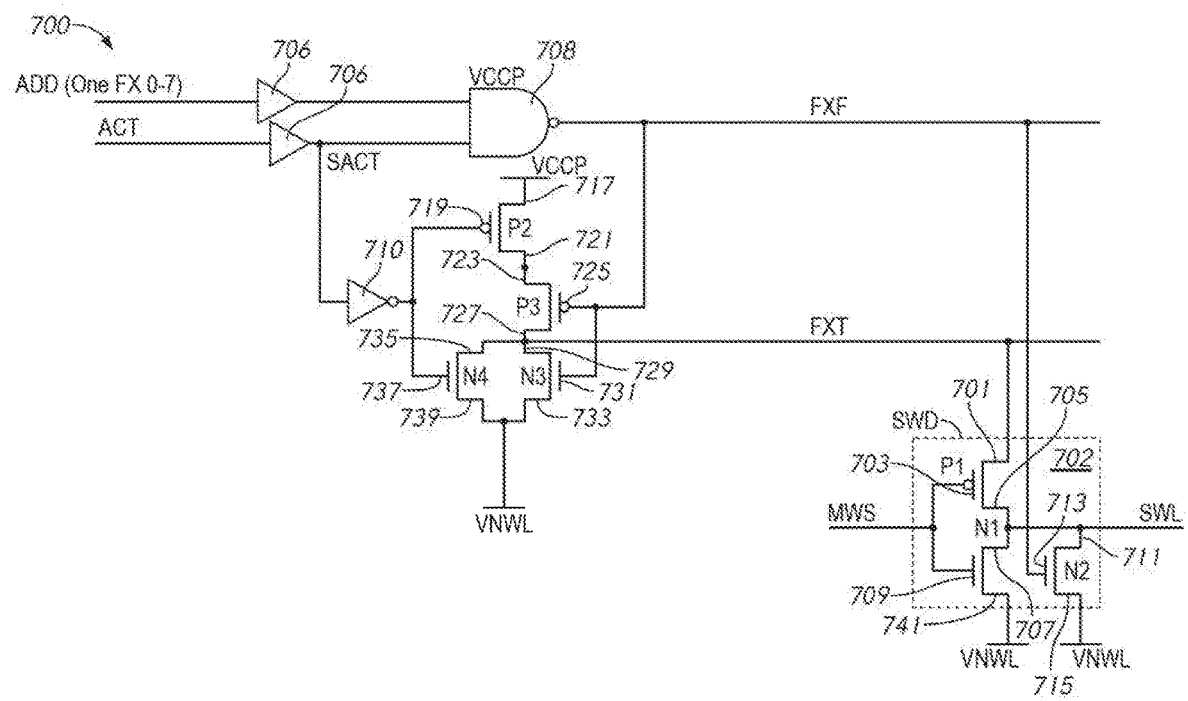
FIG. 7 is a circuit diagram of a word driver according to some examples described in the disclosure.

FIG. 7 is a circuit diagram of a word driver FXD 700 according to some examples described in the disclosure. The FXD 700 may be included in word drivers FXD shown in FIG. 5 and/or word driver 604 shown in FIG. 6 in some embodiments. The FXD 700 may also be included in a row decoder, such as row decoder 12 in FIG. 1 in some embodiments. FXD 700 may also be included in a peripheral region of a memory cell array, such as memory cell array 500 shown in FIG. 5 in some embodiments. For context, a subword driver SWD 702 associated with the FXD 700 is also shown. The SWD 702 may be used to implement the subword drivers SWD0-7 shown in FIG. 6 in some embodiments.

Before explaining the details of the FXD 700, the SWD 702 will be described. In some examples, the SWD 702 may include a P-channel type transistor P1 and N-channel type transistors N1 and N2. In some examples, the transistor P1 is a p-channel field effect transistor (pFET) and transistors N1 and N2 are n-channel field effect transistors (nFET). The transistors P1 and N1 may be serially coupled to each other at nodes 705 and 707, respectively, and a main word signal MWS is provided to their gate electrodes (e.g., gate nodes) 703 and 709, respectively. A driving signal FXT is provided to the node 701 (e.g., drain or source) of the transistor P1, and the non-active potential VNWL is provided to the node 741 (e.g., drain or source) of the transistor N1. The nodes 705 and 707 (e.g., drains or sources) of the transistors P1 and N1 may be coupled to subword line SWL. A driving signal FXF is provided to the gate electrode 713 of the transistor N2, with its node 711 (e.g., drain or source) being connected to the subword line SWL, and the non-active potential VNWL is provided to its node 715 (e.g., drain or source).

As described, the main word signal MWS is provided by a main word driver MWD and the driving signals FXT and FXF are provided by the word driver FXD 700. FIG. 7 shows the word driver for one memory bank, however, the word driver 700 may also be implemented in other banks in the memory cell array (e.g., 11 in FIG. 1, 302 in FIG. 3, 500 in FIG. 5) in some embodiments. Further, the subword driver 702 may be implemented as one or more subword drivers in one or more memory mats and/or one or more memory banks in the memory cell array (e.g., 11 in FIG. 1, 302 in FIG. 3, 500 in FIG. 5) in some embodiments.

With further reference to FIG. 7, complementary driving signals FXT and FXF may become active (e.g., FXT is at a high level such as VCCP and FXF is at low level such as VSS) when the word driver FXD is activated. In some examples, the main word signal MWS may be an active low signal. When MWS becomes active (e.g., at a low logic level), the SWL is selected. When the main word signal MWS and the driving signals FXT and FXF are activated (e.g., MWS and FXF are low and FXT is high), transistors N1 and N2 are not activated, but the transistor P1 is activated to provide the pull-up voltage for the SWD. For example, the corresponding subword line SWL is driven to the VCCP level that is an active potential of the FXT signal.

Conversely, when the main MWS is active and driving signals FXT and FXF are inactive (e.g., MWS is low, FXF is high and FXT is low), then the P-channel transistor P1 is activated and the N-channel transistor N1 is activated. The high logic level of FXF activates the N-channel transistor N3, thus the FXT is at the non-active potential, e.g., VNWL. Further, the N-channel transistor N2 is activated. Both the P-channel transistor P1 and the N-channel transistor N2 will cause the subword line SWL to be pulled down to the non-active potential, e.g., at VNWL. While the FXD 700 is shown as providing driving signals FXT and FXF to one subword line driver SWD 702, FXD 700 may provide driving signals to multiple subword drivers, for example, as described in reference to FIGS. 5 and 6.

In some examples, when MWS becomes inactive (e.g., at logic high level), the SWL is unselected. The FXF may also be inactive (e.g., at logic high level). In such case, both transistors P1 and N1 are inactive, and the SWL may be pulled down to the non-active potential.

Returning to the FX driver (e.g., FXD 700), various control signals may be provided to control the operation of the FXD 700. In the example shown in FIG. 7, the FXD 700 receives an address signal ADD, an activation signal ACT. The address signal ADD may be provided by an address decoder circuit, such as address decoder circuit 32 shown in FIG. 1 or a refresh control circuit, such as refresh control circuit 16 shown in FIG. 1. As noted in FIGS. 5 and 6, row address bits RA0-2 may be used to indicate one of eight FX drivers (e.g., FX0-7). FXD 700 may be one of the eight FX drivers in some examples. In some embodiments, RA0-2 may be the most significant bits (MSB) of the row address. Accordingly, during certain operations (e.g., refresh operations) where a counter transitions through sequential row addresses, as address bits RA3-9, 10-12 are counted through, the FX driver indicated by RA0-2 remains selected (e.g., address signal ADD remains in an active state). After address bits RA3-9, 10-12 have been counted through, the address bits RA0-2 may be incremented and the address signal ADD may transition to an inactive state to deselect the current FX driver and a different FX driver may be selected.

The activation signal ACT may be an ACT command signal provided by a command decoder circuit such as command decoder circuit 34 shown in FIG. 1. When a memory bank associated with the word driver FXD becomes active, the activation signal ACT is provided as an active signal (e.g., at a high logic level). The activation signal ACT may be provided to a level shifter 706 to raise the voltage of the signals to VCCP to provide a SACT signal. The ACT signal and the SACT signal both have active high logic levels, but the voltage of the active high levels may be different. In some examples, ADD and SACT may be at 1.2V prior to the level shifter and output at 3.1V from the level shifter. ADD and SACT may be provided as inputs to a NAND gate 708 that outputs driving signal FXF. FXF remains in an inactive state (e.g., at a high logic level) unless both ADD and SACT are high.

FXD 700 may include two P-channel transistors P2 and P3 coupled in series at nodes 721 and 723 respectively, where transistor P3 is further coupled in series at node 727 with an N-channel transistor N3 at node 729. A node 717 of transistor P2 may be coupled to VCCP. FXF is provided to the gate 725 of P3 and gate 731 of N3. The transistors P2 and N3 may be coupled at a common node 727, 729 and may also be coupled to a word driver line that provides driving signal FXT. The word driver FXD 700 may further include an N-channel transistor N4 and an N-channel transistor N3, which may be coupled in parallel to a non-active potential VNWL. For example, the source/train of the transistors may be coupled to the common node 729, 735. The other source/drain of the transistors N3 and N4 may be coupled to a common non-active potential. The nodes 733 and 739 of transistors N3 and N4 respectively, may be coupled to a non-active potential VNWL. The gate 719 of transistors P2 and gate 737 of N4 may receive an inverted SACT signal from inverter 710.

The FXD 700 may operate such that driving signal FXT is driven to the non-active potential VNWL in an inactive state unless both ADD and SACT are high. For example, if ADD is low (e.g., FXD 700 is no longer indicated by the address RA0-2), FXF and FXT will be inactive (e.g., FXF high, FXT low), regardless of the state of SACT. Similarly, if SACT is low, regardless whether FXD is selected, FXF and FXT will be inactive. When the driving signals FXT and FXF are inactive, and when MWS is active low, the P-channel transistor P1 may be activated, the N-channel transistor N1 may be deactivated and N-channel transistor N2 may be activated. Both P1 and N2 may pull down the subword line SWL to the non-active potential VNWL. Conversely, when ADD and SACT signals are both active (e.g., at high logic levels), the FXF may be at a low voltage. This activates transistor P3 and deactivates transistor N3 and the inverted SACT signal activates transistor P2 and deactivates transistor N4 such that FXT is driven to an active potential, such as VCCP.

During a precharge operation, a precharge command PRE may be provided, for example, by the command decoder circuit 34 (in FIG. 1). During the precharge, the activation signal ACT will be inactive, to deactivate the FXD such that the driving signals FXT and FXF become inactive. The main word signal MWS may be inactive. The P-transistor P1 will be deactivated and the N-transistor N1 will be activated. The N-transistor N2 may be activated. As such, the subword line SWL is pulled down to the non-active potential, e.g., VNWL, via N-channel transistors N1 and N2.

Figure 8:
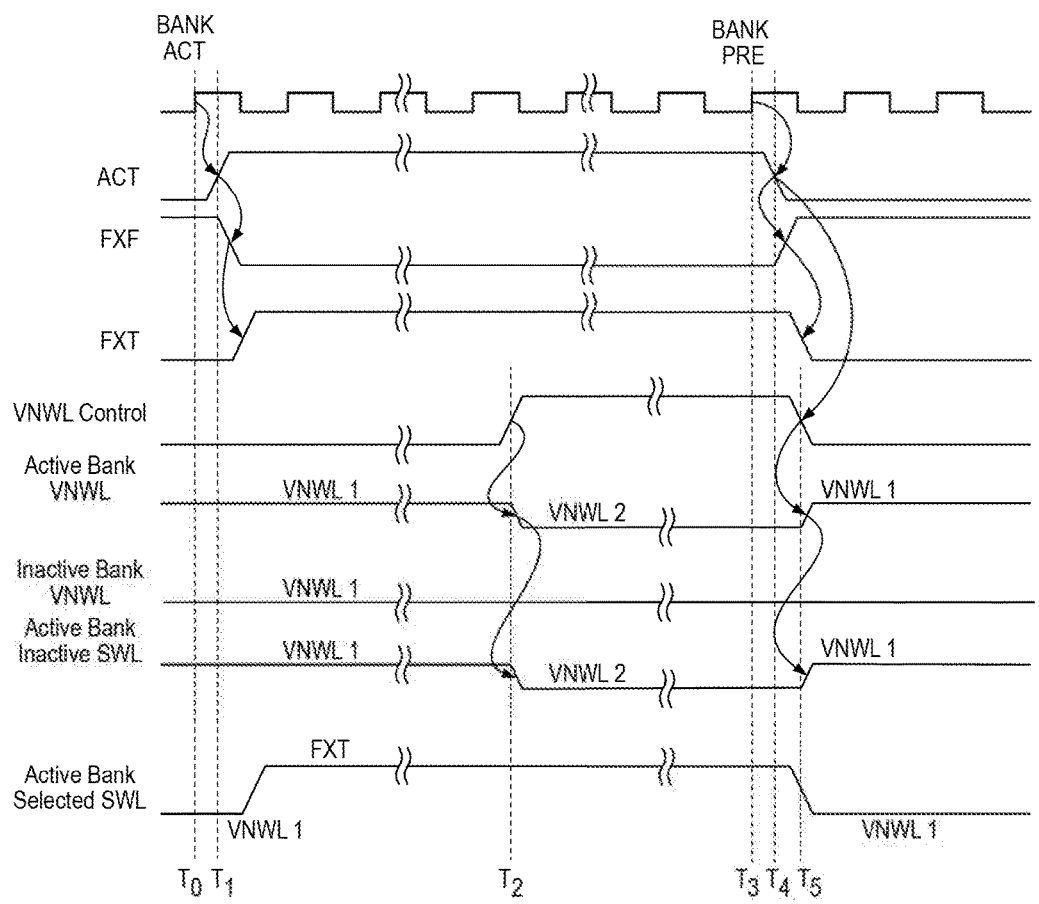
FIG. 8 is a timing diagram of various signals during operation of a driver circuit according to some examples described in the disclosure.

FIG. 8 is a timing diagram of various signals during the operation of a driver circuit according to some examples described in the disclosure. In some embodiments of the disclosure, the driver circuit of FIG. 7 may be operated according to the example operation of timing diagram 800. The timing diagram 800 will be described with reference to the driver circuit of FIG. 7.

Around time T0, a memory bank is selected, a memory bank activation command is received by a semiconductor device. In some examples, the semiconductor device may be the semiconductor device 10 of FIG. 1 and may include the driver circuit of FIG. 7. At or around time T1, responsive to the bank activation command, an activation signal ACT may become active (e.g., high logic level) indicating active operation of the memory. Responsive to the active ACT signal, the SACT signal transitions to a high logic level to activate the transistor P2 and deactivate the transistor N4. Assuming the memory bank is already selected and the address signal ADD is provided to the memory bank at a high logic level, the NAND gate 708 provides an active driving signal FXF (e.g., active low logic level). The active FXF signal activates the transistor P3 and deactivates the transistor N3. The activated transistors P2 and P3 drive the driving signal FXT to VCCP. Both FXT and FXF become active.

As described in the present disclosure, when a memory is activated, the VNWL control (in FIG. 3) may change for the active bank to a lower voltage after a time duration according to the example timing diagram as shown in FIG. 4. For example, at or around time T2, the VNWL control may become active (e.g., at high logic level). As shown in FIG. 8, activation of the VNWL control after a time duration may cause the non-active potential VNWL to transition from the default VNWL, e.g., VNWL1, to the reduced voltage VNWL, e.g., VNWL2. As described with reference to FIGS. 3 and 4, for an inactive memory bank, the non-active potential VNWL remains at the default voltage, such as VNWL With further reference to FIG. 8, for the activated memory bank, if an associated SWD is unselected (e.g., MWS is inactive low), the SWL may be inactive and provided at its non-active potential VNWL. The VNWL changing from the default VNWL to the reduced voltage VNWL will cause the inactive SWLs to change from the default VNWL to the reduced voltage VNWL. For example, at or about time T2, responsive to activation of the VNWL control signal, the inactive SWL may also transition from the default non-active potential, e.g., VNWL1, to the reduced voltage non-active potential, e.g., VNWL2. If the SWD is selected (e.g., MWS is active low), then the selected SWL signal may change with FXT. For example, if FXT is active high (FXF is active low), SWL is driven to the active potential of FXT via transistor P1 (in FIG. 7), such as VCCP.

With further reference to FIG. 8, the memory bank may be precharged responsive to a precharge command received at time T3. At or around time T4, responsive to the bank precharge command, the activation signal ACT may transition to an inactive state (e.g., low logic level). Responsive to the activation signal ACT becoming inactive, the driving signal FXF may become inactive high, and the complementary driving signal FXT may become inactive low. The selected SWL becomes inactive as the driving signals FXF and FXT become inactive. Further responsive to the activation signal ACT becoming inactive, the VNWL control signal may become inactive (e.g., at low logic level) as previously described in FIGS. 3 and 4. Responsive to the inactive VNWL control signal, the VNWL for the activated memory bank may transition from the reduced voltage non-active potential, e.g., VNWL2, to the default non-active potential, e.g., VNWL1. As a result, the non-active potential VNWL of inactive SWL (MWS is active low) may transition from the reduced voltage VNWL2 to the default non-active potential VNWL1 responsive to the deactivation of VNWL control signal. Similarly, the VNWL for the inactive banks may stay at the default non-active potential, e.g., VNWL1.

The various embodiments described in FIGS. 1-8 provide advantages in reducing the access device IOFF leakage by switching the non-active potential, such as off-state word line voltage VNWL, to a reduced voltage after a time duration following the ACT command has become active. The off-state word line voltage VNWL may be restored to the default negative voltage once the memory device is in precharge state. The described embodiments in the present disclosure may reduce the access device IOFF leakage without compromising the performance of the memory device.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a plurality of subword lines;
   a plurality of subword drivers configured to drive a selected one of the plurality of subword lines with an active voltage and unselected ones of the plurality of subword lines with an inactive voltage responsive to an activation command; and
   an inactive word line voltage control circuit coupled to a node of each of the plurality of subword line drivers, the inactive word line voltage control circuit configured to provide the inactive voltage and further configured to shift the inactive voltage on the node from a first off-state word line voltage (VNWL) to a second VNWL lower than the first VNWL responsive to the activation command.

2. The apparatus of claim 1, wherein the inactive word line voltage control circuit comprises a plurality of multiplexers each configured to provide the first VNWL or the second VNWL responsive to a VNWL control signal.

3. An apparatus comprising:
   a plurality of subword lines;
   a plurality of subword drivers configured to drive a selected one of the plurality of subword lines with an active voltage and unselected ones of the plurality of subword lines with an inactive voltage responsive to an activation command; and
   an inactive word line voltage control circuit coupled to each of the plurality of subword line drivers, the inactive word line voltage control circuit configured to shift the inactive voltage from a first off-state word line voltage (VNWL) to a second VNWL lower than the first VNWL responsive to the activation command,
   wherein the inactive word line voltage control circuit comprises:
      a plurality of multiplexers each configured to provide the first VNWL or the second VNWL responsive to a VNWL control signal, and
      a plurality of time control circuits, each time control circuit coupled to a respective multiplexer of the plurality of multiplexers and configured to provide the VNWL control signal to the respective multiplexer.

4. The apparatus of claim 3, wherein each time control circuit is configured to provide the VNWL control signal responsive to the activation command.

5. The apparatus of claim 4, wherein each time control circuit is provided with a time control signal and the activation command and is configured to provide the VNWL control signal after a time duration has elapsed from receiving the activation command, wherein the time duration is controlled based at least on the time control signal.

6. The apparatus of claim 5 further comprising a clock circuit coupled to the time control circuit and configured to provide a clock signal to the time control circuit, wherein the time duration is also controlled based on the clock signal.

7. An apparatus comprising:
   a plurality of word drivers configured to drive a plurality of word driver lines coupled to a memory cell array;
   an inactive word line voltage control circuit configured to provide an off-state word line voltage (VNWL) to a node of each of the plurality of word drivers, and further configured to:
      responsive to an activation signal, switch the VNWL on the node from a first voltage to a second voltage, wherein the second voltage is a reduced voltage from the first voltage.

8. The apparatus of claim 7 further comprising a plurality of subword drivers respectively coupled to corresponding word driver lines of the plurality of word driver lines, wherein each subword driver is configured to drive a respective subword line of the memory cell array, and wherein a non-active potential of the subword driver is coupled to the VNWL.

9. An apparatus, comprising:
   a plurality of memory banks; and
   a plurality of subword drivers each respectively coupled to a memory bank of a plurality of memory banks and configured to provide a subword line signal to the memory bank, wherein each subword driver comprises:
      a circuit configured to receive a main word signal and a word line driving signal and configured to provide a voltage of the word line driving signal to the subword line signal responsive to an active main word signal and to provide a non-active potential at a node to the subword line signal responsive to an inactive main word signal;
   wherein the non-active potential is provided at the node a first off-state word line voltage (VNWL) responsive to activation of a first memory bank and a second VNWL is provided after a time duration following the activation of the first memory bank, wherein the second VNWL is a voltage lower than the first VNWL.

10. The apparatus of claim 9, wherein the subword driver comprises an additional circuit coupled to a complementary word line driving signal and configured to pull down the subword line signal to the non-active potential responsive to an inactive word line driving signal.

11. The apparatus of claim 9 further comprising an inactive word line voltage control circuit configured to provide the first VNWL and the second VNWL, the inactive word line voltage control circuit comprising:
   a plurality of inactive word line control sub-circuits, each associated with a respective memory bank of the plurality of memory banks, and wherein each of the plurality of inactive word line control sub-circuits is configured to provide the first and second VNWL to the respective memory bank of the plurality of memory banks.

12. The apparatus of claim 9, wherein the non-active potential provided to a second memory bank of the plurality of memory banks switches from the first VNWL to the second VNWL responsive to activation of the second memory bank.

13. An apparatus comprising:
   a plurality of memory banks; and
   a plurality of subword drivers each respectively coupled to a memory bank of a plurality of memory banks and configured to provide a subword line signal to the memory bank, wherein each subword driver comprises:
      a circuit configured to receive a main word signal and a word line driving signal and configured to provide a voltage of the word line driving signal to the subword line signal responsive to an active main word signal and to provide a non-active potential to the subword line signal responsive to an inactive main word signal, wherein the non-active potential is provided a first off-state word line voltage (VNWL) responsive to activation of a first memory bank and a second VNWL is provided after a time duration following the activation of the first memory bank, wherein the second VNWL is a voltage lower than the first VNWL;

an inactive word line voltage control circuit configured to provide the first VNWL and the second VNWL, the inactive word line voltage control circuit comprising:

a plurality of inactive word line control sub-circuits, each associated with a respective memory bank of the plurality of memory banks, and wherein each of the plurality of inactive word line control sub-circuits is configured to provide the first and second VNWL to the respective memory bank of the plurality of memory banks, wherein each of the inactive word line control sub-circuits comprises a counter circuit coupled to a multiplexer and is configured to provide a VNWL control signal used to control the multiplexer to provide the first or second VNWL to the respective memory bank.

14. The apparatus of claim 13, wherein responsive to activation of the first memory bank the counter circuit is configured to count based on a clock signal until reaching a threshold value, and when reaching the threshold value, provide the VNWL control signal to control the multiplexer to switch from providing the first VNWL to the second VNWL to the first memory bank.

15. The apparatus of claim 14 further comprising a clock circuit configured to provide the clock signal to the time control circuit.

16. A method comprising:
activating a memory bank of a plurality of memory banks;
responsive to activating the memory bank of the plurality of memory banks, providing an active activation signal to a word driver associated with the memory bank;
responsive to activating the memory bank, providing a first off-state word line voltage (VNWL) at a node of the word driver associated with the memory bank;
responsive to precharging the memory bank, providing the node of the word driver associated with the memory bank with a second VNWL;
wherein the first VNWL is a negative voltage lower than the second VNWL.

17. The method of claim 16 further comprising:
prior to providing the first VNWL, providing the second VNWL as a non-active potential of the word driver associated with the memory bank; and
switching from the second VNWL to the first VNWL following a time duration after activating the memory bank.

18. The method of claim 16 further comprising:
generating complementary word driving signals responsive to the activation signal of the word driver being activated and an address line of the word driver being activated;
providing an active potential to a subword line at a subword driver responsive to an active main word signal and responsive to active complementary word driving signals; and
providing a non-active potential to the subword line at the subword driver responsive to an inactive main word signal.

19. The method of claim 18, wherein providing the non-active potential at the subword driver comprises controlling a multiplexer to select the first VNWL or the second VNWL responsive to a VNWL control signal.

20. The method of claim 19 further comprising providing the VNWL control signal responsive to activating the memory bank.

21. A method comprising:
activating a memory bank of a plurality of memory banks;
responsive to activating the memory bank of the plurality of memory banks, providing an active activation signal to a word driver associated with the memory bank;
responsive to activating the memory bank, providing a first off-state word line voltage (VNWL) as a non-active potential of the word driver associated with the memory bank;
responsive to precharging the memory bank, providing the non-active potential of the word driver associated with the memory bank with a second VNWL, wherein the first VNWL is a negative voltage lower than the second VNWL;
prior to providing the first VNWL, providing the second VNWL as the non-active potential of the word driver associated with the memory bank; and
switching from the second VNWL to the first VNWL following a time duration after activating the memory bank, wherein the time duration is controlled by causing a counter to count based on a clock signal until reaching a threshold value, wherein the threshold value is defined in a fuse array.

22. A method comprising:
activating a memory bank of a plurality of memory banks;
responsive to activating the memory bank of the plurality of memory banks, providing an active activation signal to a word driver associated with the memory bank;
responsive to activating the memory bank, providing a first off-state word line voltage (VNWL) as a non-active potential of the word driver associated with the memory bank;
responsive to precharging the memory bank, providing the non-active potential of the word driver associated with the memory bank with a second VNWL, wherein the first VNWL is a negative voltage lower than the second VNWL;
prior to providing the first VNWL, providing the second VNWL as the non-active potential of the word driver associated with the memory bank;
switching from the second VNWL to the first VNWL following a time duration after activating the memory bank;
activating an additional memory bank of a plurality of memory banks;
responsive to activating the additional memory bank, switching the non-active potential of the word driver associated with the additional memory bank from the second VNWL to the first VNWL;
precharging the additional memory bank; and
responsive to precharging the additional memory bank, switching the non-active potential of the word driver associated with the additional memory bank from the first VNWL to the second VNWL.

23. The method of claim 22, wherein:
activating the additional memory bank occurs after activating the memory bank; and precharging the additional memory bank occurs before precharging the first memory bank.

24. The method of claim 22, wherein:
providing the second VNWL as the non-active potential of the word driver associated with the memory bank responsive to activation of the memory bank occurs following switching the non-active potential of the word driver associated with the additional memory bank from the first VNWL to the second VNWL.

* * * * *